(12) United States Patent
Tirado et al.

(10) Patent No.: US 9,244,107 B2
(45) Date of Patent: Jan. 26, 2016

(54) HEAT SINK BLADE PACK FOR DEVICE UNDER TEST TESTING

(71) Applicant: Marvell World Trade Ltd., St. Michael (BB)

(72) Inventors: Bruce Tirado, San Jose, CA (US); Scott Wu, San Jose, CA (US); William Su, Sunnyvale, CA (US); David Ganapol, Scotts Valley, CA (US); Robert P. Zaldain, San Jose, CA (US); Reid T. Hirata, Union City, CA (US); Tom Lim, Cupertino, CA (US)

(73) Assignee: Marvell World Trade Ltd., St. Michael (BB)

( * ) Notice: Subject to any disclaimer, the term of this patent is extended or adjusted under 35 U.S.C. 154(b) by 124 days.

(21) Appl. No.: 14/076,058

(22) Filed: Nov. 8, 2013

(65) Prior Publication Data

US 2014/0132296 A1    May 15, 2014

Related U.S. Application Data

(60) Provisional application No. 61/725,241, filed on Nov. 12, 2012.

(51) Int. Cl.
| | |
|---|---|
| *G01R 31/10* | (2006.01) |
| *G01R 31/00* | (2006.01) |
| *G01R 31/26* | (2014.01) |
| *G01R 31/28* | (2006.01) |

(52) U.S. Cl.
CPC .......... *G01R 31/003* (2013.01); *G01R 31/2601* (2013.01); *G01R 31/2867* (2013.01); *G01R 31/2877* (2013.01)

(58) Field of Classification Search
CPC ............. G01R 1/0458; G01R 31/2863; G01R 1/07328; G01R 31/2874; G01R 31/2891; G01R 31/2868; G01R 31/003; G01R 31/2601; G01R 31/2867; G01R 31/2877; G01R 31/2851; G01R 31/2887; G01R 31/2893; G01R 31/2886
USPC ............... 324/750.09, 750.2, 750.03–750.04, 324/750.06–750.08, 750.11; 165/80.1–80.3; 361/679.46
See application file for complete search history.

(56) References Cited

U.S. PATENT DOCUMENTS

| | | | | |
|---|---|---|---|---|
| 6,019,164 | A | * | 2/2000 | Getchel ............. H01L 21/67103 118/728 |
| 6,019,166 | A | * | 2/2000 | Viswanath ........ H01L 21/67109 118/724 |
| 6,073,681 | A | * | 6/2000 | Getchel ............. H01L 21/67103 118/728 |
| 6,104,203 | A | * | 8/2000 | Costello ............. G01R 31/2601 165/11.1 |
| 6,119,460 | A | * | 9/2000 | Huang .................... F25B 21/02 136/242 |
| 6,124,725 | A | * | 9/2000 | Sato .................... G01R 31/2851 324/754.03 |
| 6,140,616 | A | * | 10/2000 | Andberg ........... H01L 21/67248 118/724 |

(Continued)

*Primary Examiner* — Patrick Assouad
*Assistant Examiner* — Sean Curtis

(57) ABSTRACT

Embodiments of the present disclosure provide an apparatus configured to engage a device for testing the device via automatic test equipment. The apparatus includes a heat sink, wherein the heat sink comprises a plurality of fins extending from the heat sink, and wherein the heat sink is configured to engage the device. The apparatus further includes a heat conduction layer coupled to the heat sink, a first leg coupled to the heat conduction layer, and a second leg coupled to the heat conduction layer. The second leg is spaced apart from the first leg. A vacuum path is defined through (i) the heat conduction layer and (ii) the heat sink. The vacuum path permits the apparatus to engage the device to be tested by the automatic test equipment.

18 Claims, 6 Drawing Sheets

(56) References Cited

U.S. PATENT DOCUMENTS

| | | | | |
|---|---|---|---|---|
| 6,328,096 B1 * | 12/2001 | Stone | H01L 21/67103 | 118/728 |
| 6,415,858 B1 * | 7/2002 | Getchel | B23Q 11/126 | 165/101 |
| 6,501,290 B2 * | 12/2002 | Kvanvig | G01R 31/2875 | 324/750.09 |
| 6,540,014 B2 * | 4/2003 | Getchel | H01L 21/67103 | 118/728 |
| 6,545,494 B1 * | 4/2003 | Olsen | G05D 23/203 | 324/73.1 |
| 6,552,561 B2 * | 4/2003 | Olsen | G05D 23/203 | 324/73.1 |
| 6,570,374 B1 * | 5/2003 | Moldavsky | B25B 11/005 | 279/3 |
| 6,644,703 B1 * | 11/2003 | Levin | B25J 15/0616 | 279/3 |
| 6,700,099 B2 * | 3/2004 | Cole, Sr. | G01R 31/2891 | 118/724 |
| 6,703,853 B1 * | 3/2004 | Wee | G01R 1/0408 | 324/750.03 |
| 6,802,368 B2 * | 10/2004 | Getchel | B23Q 11/126 | 165/101 |
| 6,886,976 B2 * | 5/2005 | Gaasch | G01R 1/0458 | 324/750.09 |
| 7,501,810 B2 * | 3/2009 | Dunklee | G01R 31/2887 | 324/754.03 |
| 7,567,090 B2 * | 7/2009 | Cote | G01R 31/2877 | 165/80.4 |
| 7,852,096 B2 * | 12/2010 | Eickhoff | G01R 31/2808 | 324/750.09 |
| 8,268,670 B2 * | 9/2012 | Tashiro | H01L 21/50 | 257/704 |
| 8,468,690 B2 * | 6/2013 | Kumagai | G01R 31/2893 | 29/832 |
| 8,471,575 B2 * | 6/2013 | Fregeau | G01R 31/2874 | 324/750.03 |
| 2002/0109518 A1 | 8/2002 | Saito et al. | | |
| 2003/0030430 A1 * | 2/2003 | Pfahnl | G01R 31/2874 | 324/750.09 |
| 2009/0174427 A1 * | 7/2009 | Weinraub | G01R 31/2863 | 324/757.02 |
| 2011/0095773 A1 * | 4/2011 | Matsuzawa | G01R 31/2877 | 324/750.09 |
| 2011/0267082 A1 * | 11/2011 | Fregeau | G01R 31/2874 | 324/750.03 |
| 2011/0267084 A1 * | 11/2011 | Erwin | G01R 31/2884 | 324/750.09 |

* cited by examiner

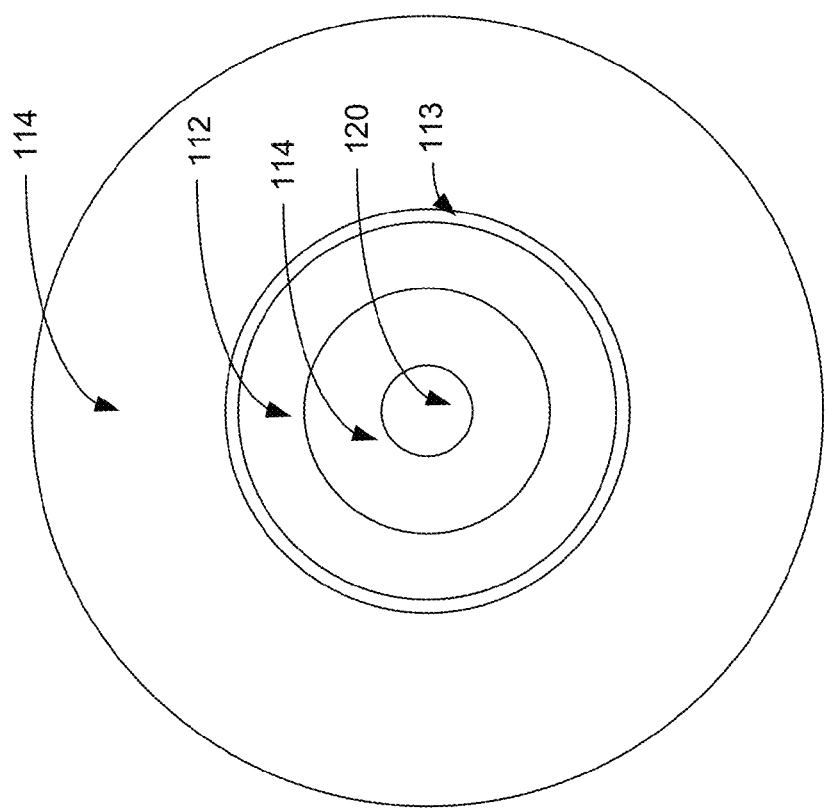

HEAT SINK BLADE PACK FOR DEVICE UNDER TEST TESTING

CROSS REFERENCE TO RELATED APPLICATIONS

The present disclosure is a non-provisional of and claims priority to U.S. Provisional Patent Application No. 61/725,241, filed Nov. 12, 2012, which is incorporated herein by reference.

TECHNICAL FIELD

Embodiments of the present disclosure relate to the field of semiconductor processing, and more particularly, to testing semiconductor devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

When testing small micro-electronic devices such as, for example, chips, semiconductor dies, etc., the device under test is generally tested in automatic test equipment. The device under test is picked up automatically by an apparatus that engages the device under test and applies a vacuum to hold the device under test in place. The device under test is moved to a testing socket of the automatic test equipment and coupled to the testing socket. The device under test is then subjected to various testing procedures and operations.

When performing the test procedures, it is desirable to stress the device under test to ensure that the device under test's physical characteristics can withstand various environments. Thus, the device under test is generally tested under high ambient temperatures such as, for example, approximately 90 degrees Celsius. When operating, the device under test generates an internal temperature of approximately 35 degrees Celsius. Thus, during the testing procedures, the device under test is subjected to approximately 125 degrees Celsius, which is the sum of the ambient temperature and the internal operating temperature of the device under test. However, every device is generally different and can thus create higher or lower internal operating temperatures. Thus, it can be difficult to create and maintain an overall testing environment temperature of 125 degrees Celsius. While it is desirable to stress the device under test, it is not desirable to subject the device under test to temperatures that are too high since it can cause damage to the device under test and thus, lead to failure of the device under test.

SUMMARY

The present disclosure provides an apparatus configured to engage a device for testing the device via automatic test equipment. The apparatus includes a heat sink, wherein the heat sink comprises a plurality of fins extending from the heat sink, and wherein the heat sink is configured to engage the device. The apparatus further includes a heat conduction layer coupled to the heat sink, a first leg coupled to the heat conduction layer, and a second leg coupled to the heat conduction layer. The second leg is spaced apart from the first leg. A vacuum path is defined through (i) the heat conduction layer and (ii) the heat sink. The vacuum path permits the apparatus to engage the device to be tested by the automatic test equipment.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments of the disclosure are illustrated by way of example and not by way of limitation in the figures of the accompanying drawings.

FIG. 1A is plan view of an end portion of a heat sink of the apparatus of FIG. 1, in accordance with various embodiments of the present disclosure.

DETAILED DESCRIPTION

In the following detailed description, reference is made to the accompanying drawings which form a part hereof wherein like numerals designate like parts throughout, and in which is shown by way of illustration embodiments in which the teachings of the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Figure 1:
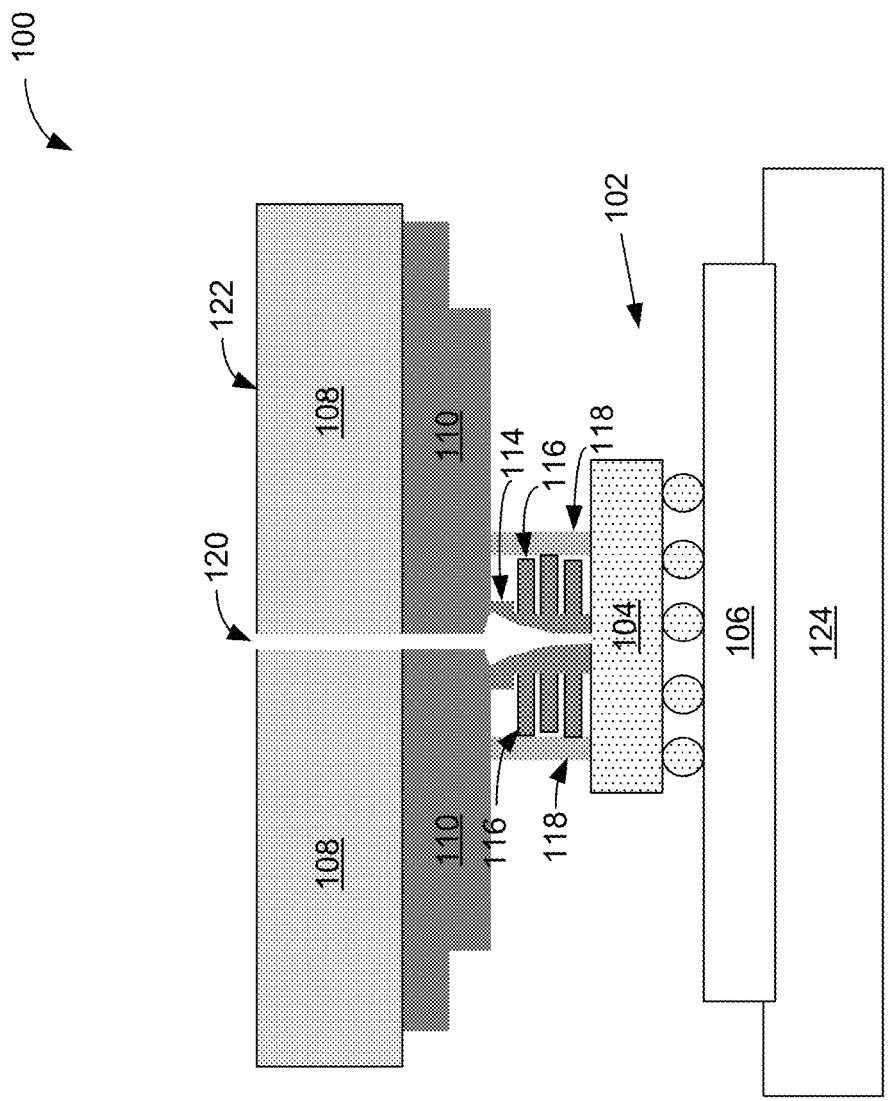
FIG. 1 is a cross-sectional view of an apparatus for engaging a micro-electronic device for testing in automatic test equipment, in accordance with various embodiments of the present disclosure.

FIG. 1 illustrates an apparatus 100, generally referred to as a heat-sink blade pack, that can be coupled to a vacuum source (not illustrated) for engaging and moving micro-electronic devices to and from a testing socket of automatic test equipment for testing of the micro-electronic devices. The apparatus 100 is generally attached to some type of arm or lever (not illustrated) that moves the apparatus 100 vertically and horizontally to thereby move engaged micro-electronic devices. The apparatus 100 engages a micro-electronic device via an applied vacuum, as is known and will be further described herein.

The apparatus 100 is utilized to engage a device under test 102. In the example of FIG. 1, the device under test 102 is a semi-conductor chip 104 that is ball grid array (BGA) coupled to a substrate 106.

The apparatus 100 includes a first heat conduction layer 108, a second heat conduction layer 110. The apparatus 100 may also include a conformant component 112 (illustrated in FIG. 1A), as generally discussed further herein. The apparatus 100 further includes a heat sink 114 that includes a plurality of fins 116 that extend radially from the heat sink 114. The apparatus 100 further includes legs 118 to provide support. The fins 116 may or may not engage the legs 118 and may actually be part of the legs 118. The legs 118 can also be part of the second heat conduction layer 110, i.e. the legs 118 (and optionally the heat sink 114) and the second heat conduction layer 110 can be a single piece, if desired. While FIG. 1 is a cross-sectional view, the fins 116 are generally circular in shape. However, other shapes can be utilized if desired. Likewise, first heat conduction layer 108 and second heat conduction layer 110 can be of various shapes such as, for example, circular, square, rectangular, etc.

A vacuum path 120 is defined through the first heat conduction layer 108, the second heat conduction layer 110, and the heat sink 114. The vacuum path 120 thus extends from the device under test 102 to a top surface 122 of the first heat conduction layer 108. During use, the vacuum source (not illustrated) applies a vacuum to engage the device under test 102 via the vacuum path 120 thus allowing the apparatus 100 to move the device under test 102 to and from a socket 124 of automatic test equipment with which the apparatus 100 is used.

Heat from the device under test 102 can also be conducted through the heat sink 114 and legs 118 to the second heat conduction layer 110 and thereby to the first heat conduction layer 108. During testing, air is moved through the chamber of the automatic test equipment that includes the apparatus 100 and the socket 124. The air moves through the fins 116 to thereby create a cooling effect of the heat sink 114 by extracting heat from the fins 116. Such air movement helps move heat from the device under test 102, and from around the device under test 102, by extracting heat from the heat sink 114. The heated air from the fins 116 can also help control the ambient temperature within the automatic test equipment chamber.

Referring to FIG. 1A, a conformant component 112 may be included at an end of the heat sink 114 that is configured to engage semiconductor chip 104. In an embodiment, the conformant component 112 is an elastic o-ring coupled to the heat sink within a cavity 113 defined within the heat sink 114 such that the open portion of the o-ring surrounds the vacuum path 120. The elastic o-ring is coupled to the heat sink 114 such that the o-ring is biased away from the heat sink 114. When the apparatus is used to test the device under test 102 such that the heat sink 114 engages the device under test 102, the o-ring moves away from the device under test 102 into the cavity 113 to allow the heat sink 114 to directly engage the device under test 102. While the end of heat sink 114 is illustrated as round, other shapes can be used if desired. The conformant component 112 provides adaptability for the apparatus 100 by allowing the apparatus 100 to be used with different sized devices for testing. The conformant component 112 allows the apparatus to conform to various sized devices having different dimensions, such as, for example, height, thickness, etc., for testing. The conformant component 112 can also help protect the device under test 102 against cracking from too much pressure from apparatus 100.

In accordance with various embodiments, the first and second heat conduction layers 108, 110 may be a single layer. Likewise, legs 118 may be a part of the second heat conduction layer 110. Thus, the first and second heat conduction layers 108, 110 and/or legs 118 may be a single entity. The first and second heat conduction layers 108, 110, heat sink 114, as well as legs 118, can be made from various types of metal suitable for heat conduction.

Figure 2:
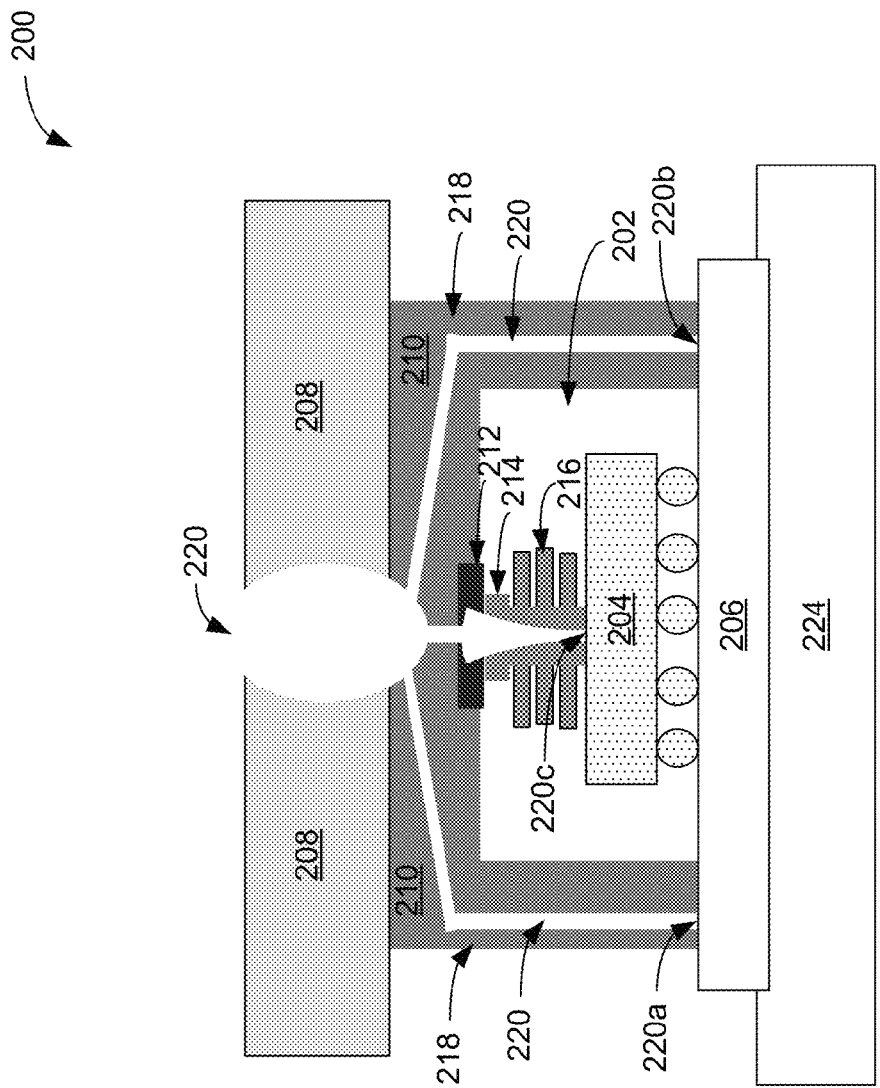
FIG. 2 is a cross-sectional view of another apparatus for engaging a micro-electronic device for testing in automatic test equipment, in accordance with various embodiments of the present disclosure.

FIG. 2 illustrates another embodiment of an apparatus 200 for moving devices under test to and from a testing socket of automatic test equipment in accordance with the present disclosure. The apparatus 200 includes a first heat conduction layer 208, a second heat conduction layer 210, a conformant layer 212 and a heat sink 214. The heat sink 214 includes a plurality of fins 216 that are generally circular in shape. The second heat conduction layer 210 also includes legs 218 that are further in position away from the heat sink 214 as opposed to the legs 118 of the embodiment illustrated in FIG. 1. The legs 218 can be part of the second heat conduction layer 210, i.e. the legs 218 and the second heat conduction layer 210 can be a single entity, if desired.

A vacuum path 220 is defined through the first and second heat conduction layers 208, 210, the conformant layer 212 and the heat sink 214. Furthermore, the vacuum path 220 also extends through the legs 218. Thus, the vacuum path 220 now terminates at three points 220a, 220b and 220c for engaging the device under test 202. Two of the three points, 220a and 220b defined within the legs 218, can engage the substrate 206 of the device under test 202. The third point, 220c defined within the heat sink 214, engages the semiconductor chip 204 of the device under test 202.

As the device under test 202 is tested, heat from the device under test 202 is conducted through the heat sink 214 and legs 218 to the second heat conduction layer 210 and thereby to the first heat conduction layer 208. During testing, air is moved through the chamber of the automatic test equipment that includes the apparatus 200 and the socket 224. The air moves through the fins 216 to thereby create a cooling effect of the heat sink 214 by extracting heat from the fins 216. Such air movement helps move heat from the device under test 202, and from around the device under test 202, by extracting heat from the heat sink 214. The heated air from the fins 216 can also help control the ambient temperature within the automatic test equipment chamber. Furthermore, heat can be conducted through the legs 218 to the second heat conduction layer 210 and thereby to the first heat conduction layer 208.

The conformant layer 212 provides adaptability for the apparatus 200 by allowing the apparatus 200 to be used with different sized devices for testing. The conformant layer 212 is generally a flexible or a "spring" type layer allowing the apparatus 200 to conform to various sized devices having different dimensions, such as, for example, height, thickness, etc., for testing when a vacuum is applied to cause the heat sink 214 to engage the device under test 202 and pull on the device under test 202. The conformant layer 212 can also help protect the device under test 202 against cracking from too much pressure from apparatus 200. The conformant layer 212 may be made from a heat conductive material to assist with conducting heat away from the device under test 202 or may be made from a heat resistant material.

Figure 3:
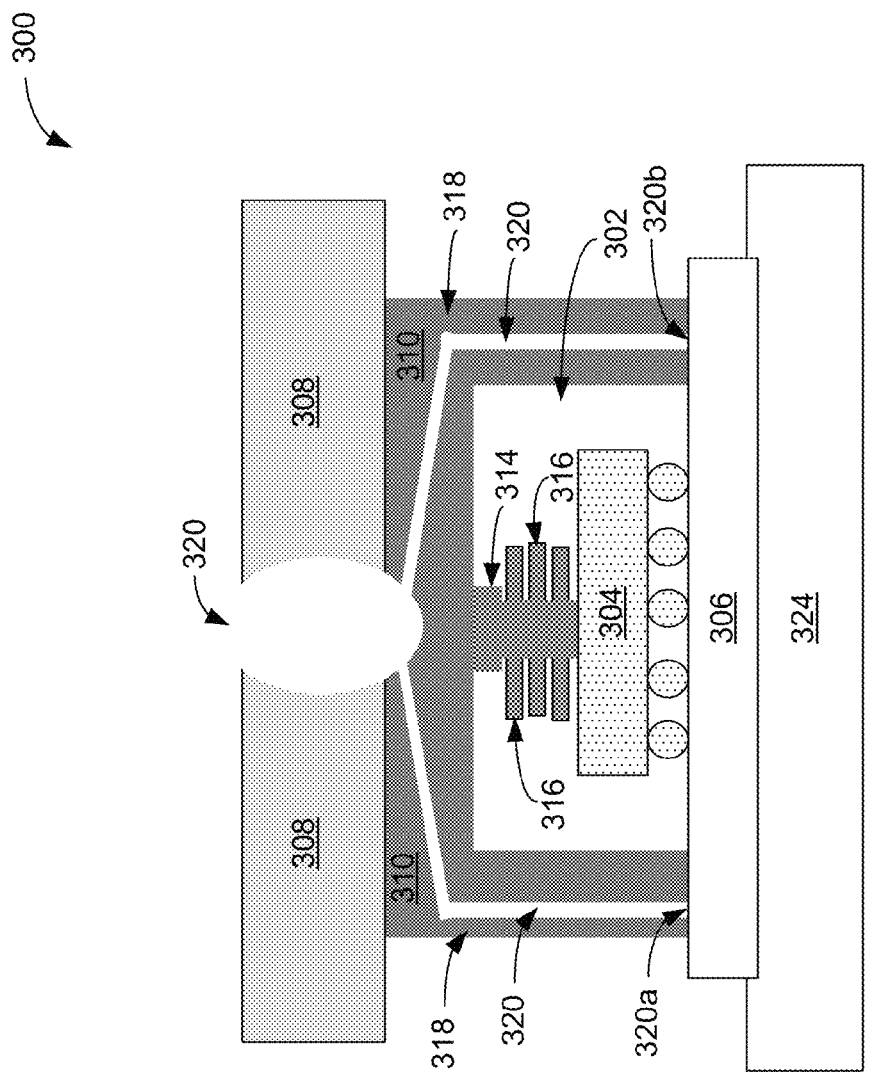
FIG. 3 is a cross-sectional view of another apparatus for engaging a micro-electronic device for testing in automatic test equipment, in accordance with various embodiments of the present disclosure.

In accordance with various embodiments, the first and second heat conduction layers 208, 210 may be a single layer. Likewise, as previously noted, the legs 218 may be a part of the second heat conduction layer 210. Thus, the first and second heat conduction layers 208, 210 and/or legs 218 may be a single entity. The first heat conduction layer 208 and second heat conduction layer 210 can be of various shapes such as, for example, circular, square, rectangular, etc. The first and second heat conduction layers 208, 210, heat sink 214, as well as legs 218, can be made from various types of metal suitable for heat conduction FIG. 3 illustrates another embodiment of an apparatus 300 similar to the apparatus 200 illustrated in FIG. 2. The apparatus 300 however does not include a conformant layer. Furthermore, the apparatus 300 illustrated in FIG. 3 does not include a vacuum path defined through the heat sink 314 to engage the semiconductor chip 304 of the device under test 302. Thus, the apparatus 300 of FIG. 3 only includes two vacuum points 320a, 320b located within the legs 318. Thus, the two vacuum points 320a, 320b in the apparatus of FIG. 3 engage a substrate of the device under test.

In accordance with various embodiments, the first and second heat conduction layers 308, 310 may be a single layer. Likewise, legs 318 may be a part of the second heat conduction layer 310. Thus, the first and second heat conduction layers 308, 310 and/or legs 318 may be a single entity. The first heat conduction layer 308 and second heat conduction layer 310 can be of various shapes such as, for example, circular, square, rectangular, etc. The first and second heat conduction layers 308, 310, heat sink 314, as well as legs 318, can be made from various types of metal suitable for heat conduction.

Figure 4:
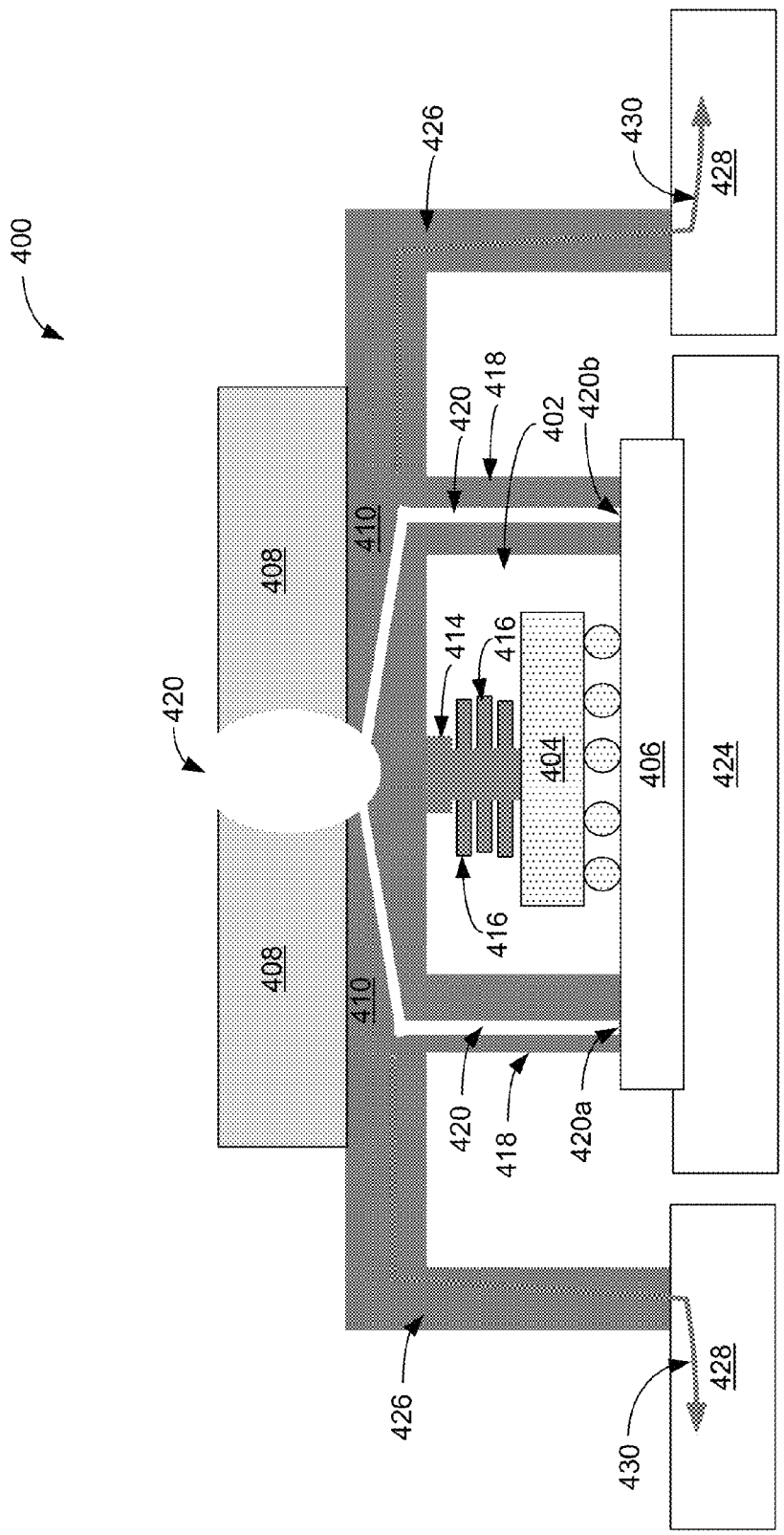
FIG. 4 is a cross-sectional view of another apparatus for engaging a micro-electronic device for testing in automatic test equipment, in accordance with various embodiments of the present disclosure.

FIG. 4 illustrates another embodiment of an apparatus 400 for moving devices under test to and from a testing socket of automatic test equipment, in accordance with the present disclosure. The apparatus 400 illustrated in FIG. 4 includes a first heat conduction layer 408, a second heat conduction layer 410, and a heat sink 414. The apparatus 400 is similar to the apparatus 300 illustrated in FIG. 3 but also includes a side heat conduction well defined by two legs 426. The two legs 426 engage a docking plate 428 of the automatic test equipment. During testing, once again the air moving the chamber will move through the fins 416 of the heat sink 414. Likewise, heat will be conducted through the first and second heat conduction layers 408, 410. Additional heat will also be moved through the side heat conduction well as indicated by the arrows 430.

In accordance with various embodiments, the first and second heat conduction layers 408, 410 may be a single layer. Likewise, legs 418 and/or legs 426 may be a part of the second heat conduction layer 410. Thus, the first and second heat conduction layers 408, 410, legs 418 and/or legs 426 may be a single entity. The first heat conduction layer 408 and second heat conduction layer 410 can be of various shapes such as, for example, circular, square, rectangular, etc. The first and second heat conduction layers 408, 410, as well as legs 418 and 426, can be made from various types of metal suitable for heat conduction.

Figure 5:
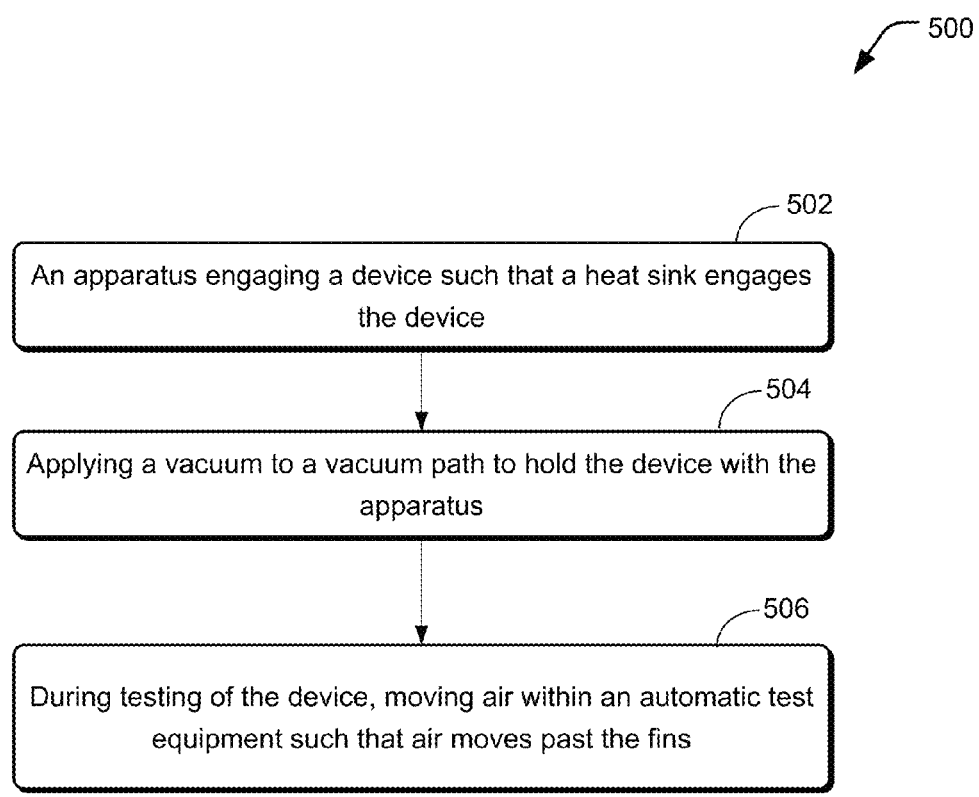
FIG. 5 is a flow diagram of a method of using an apparatus, such as one of the apparatuses illustrated in FIGS. 1-4, to engage a micro-electronic device for testing in automatic test equipment.

FIG. 5 is a flow diagram of a method 500 of using an apparatus, such as one of the apparatuses illustrated in FIGS. 1-4, to engage a micro-electronic device for testing in automatic test equipment. Thus, the apparatus generally comprises a heat sink, a heat conduction layer coupled to the heat sink, a first leg coupled to the heat conduction layer, a second leg coupled to the heat conduction layer, wherein the second leg is spaced apart from the first leg, wherein the heat sink comprises a plurality of fins extending from the heat sink, wherein the heat sink is configured to engage the device, and wherein a vacuum path is defined within the apparatus. At 502, the apparatus engages the device such that the heat sink engages the device. At 504, a vacuum is applied to the vacuum path to hold the device with the apparatus. At 506, during testing of the device, air is moved within the automatic test equipment such that air moves past the fins.

Thus, the present disclosure provides various apparatuses to allow for heat conduction around a device under test during testing of the device under test by automatic test equipment. The apparatuses are utilized to engage the device under test and move the device under test to and from a testing socket of the automatic test equipment. This is achieved by applying a vacuum source (not illustrated) to one of the apparatuses such that the termination points of the vacuum path defined within the apparatus engage the device under test and hold the device under test in place against the apparatus. Thus, the apparatus can move the device under test to and from a testing socket of automatic test equipment.

The apparatus also engages the device under test during testing. During testing, air movement within the testing chamber moves through fins included on the heat sink of the apparatuses. This helps extract heat from the heat sink into the air. Furthermore, heat is conducted through the heat sink to one or more heat conduction layers and/or legs depending upon the configuration of the apparatus. Accordingly, the apparatuses help control and maintain proper heating conditions for testing various micro-electronic devices such as semiconductor chips and devices. This can lead to improved testing of the micro-electronic devices and help prevent failure of devices under test due to overheating of the micro-electronic devices.

Various operations may be described as multiple discrete operations in turn, in a manner that may be helpful in understanding embodiments of the present disclosure; however, the order of description should not be construed to imply that these operations are order dependent.

Additionally, further aspects of this invention relate to one or more of the following clauses.

One aspect can include an apparatus that is configured to engage a device for testing the device via automatic test equipment. The apparatus includes a heat sink, wherein the heat sink comprises a plurality of fins extending from the heat sink, and wherein the heat sink is configured to engage the device. The apparatus further includes a heat conduction layer coupled to the heat sink, a first leg coupled to the heat conduction layer, and a second leg coupled to the heat conduction layer. The second leg is spaced apart from the first leg. A vacuum path is defined through (i) the heat conduction layer and (ii) the heat sink. The vacuum path permits the apparatus to engage the device to be tested by the automatic test equipment.

A conformant component can be coupled to the heat sink, wherein the conformant component is configured to adjust based upon dimensions of the device.

The conformant component can comprise an o-ring.

The vacuum path can be further defined through (i) the first leg and (ii) the second leg.

The heat conduction layer can be a first heat conduction layer. The apparatus can further comprise a second heat conduction layer coupled to the first heat conduction layer and the vacuum path is further defined through the second heat conduction layer.

The device can comprise a semiconductor chip coupled to a substrate. The first leg and the second leg can be configured to engage the substrate and the vacuum path can be defined through (i) the first leg and (ii) the second leg.

The device can comprise a semiconductor chip and (i) the first leg and (ii) the second leg can be configured to engage the semiconductor chip.

The heat conduction layer, the first leg and the second leg can be a single entity.

The apparatus can further comprise a third leg coupled to the heat conduction layer and a fourth leg coupled to the heat conduction layer. The third leg and the fourth leg can be configured to engage a docking plate of the automatic test equipment.

The heat conduction layer, the third leg and the fourth leg can be a single entity.

The heat conduction layer, the first leg, the second leg, the third leg and the fourth leg can be a single entity.

Another aspect can include a method of testing a device with automatic test equipment using an apparatus, wherein the apparatus comprises a heat sink, a heat conduction layer coupled to the heat sink, a first leg coupled to the heat conduction layer, a second leg coupled to the heat conduction layer, wherein the second leg is spaced apart from the first leg, wherein the heat sink comprises a plurality of fins extending from the heat sink, wherein the heat sink is configured to engage the device, and wherein a vacuum path is defined within the apparatus. The method comprises engaging the device with the apparatus such that the heat sink engages the device, applying a vacuum to the vacuum path to hold the device with the apparatus, and during testing of the device, moving air within the automatic test equipment such that air moves past the fins.

The vacuum path can be defined through (i) the heat conduction layer, and (ii) the heat sink. Applying the vacuum to the vacuum path to hold the device with the apparatus can comprise applying the vacuum such that the apparatus holds the device against the heat sink.

The device can comprise a semiconductor chip coupled to a substrate, and the first leg and the second leg are configured to engage the substrate. The vacuum path can be defined through the heat conduction layer, the first leg and the second leg. Applying the vacuum to the vacuum path to hold the device with the apparatus can comprise applying the vacuum such that the apparatus holds the substrate against the first leg and the second leg.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An apparatus configured to engage a device for testing the device via automatic test equipment, the apparatus comprising: a heat sink, wherein the heat sink comprises a plurality of fins extending from the heat sink, and wherein the heat sink is configured to engage the device; a heat conduction layer coupled to the heat sink; a first leg coupled to the heat conduction layer; and a second leg coupled to the heat conduction layer, wherein the second leg is spaced apart from the first leg, wherein a first vacuum path passes through the heat sink, wherein a second vacuum path passes through the first leg, wherein a third vacuum path passes through the second leg, and wherein the first vacuum path is different from each of the second vacuum path and the third vacuum path, and wherein the first vacuum path, the second vacuum path and the third vacuum path permit the apparatus to engage the device to be tested by the automatic test equipment.

2. The apparatus of claim 1, further comprising: a conformant component coupled to the heat sink, wherein the conformant component is configured to adjust based upon dimensions of the device.

3. The apparatus of claim 2, wherein the conformant component comprises an o-ring.

4. The apparatus of claim 1, wherein: the heat conduction layer is a first heat conduction layer; the apparatus further comprises a second heat conduction layer coupled to the first heat conduction layer; and each of (i) the first vacuum path, (ii) the second vacuum path, and (iii) the third vacuum path is further passes through the second heat conduction layer.

5. The apparatus of claim 1, wherein: the device comprises a semiconductor chip coupled to a substrate; and the first leg and the second leg are configured to engage the substrate.

6. The apparatus of claim 1, wherein: the device comprises a semiconductor chip; and (i) the first leg and (ii) the second leg are configured to engage the semiconductor chip.

7. The apparatus of claim 1, wherein (i) the heat conduction layer, (ii) the first leg and (iii) the second leg are a single entity.

8. The apparatus of claim 1, further comprising: a third leg coupled to the heat conduction layer; and a fourth leg coupled to the heat conduction layer, wherein (i) the third leg and (ii) the fourth leg are configured to engage a docking plate of the automatic test equipment.

9. The apparatus of claim 8, wherein (i) the heat conduction layer, (ii) the third leg and (iii) the fourth leg are a single entity.

10. The apparatus of claim 9, wherein (i) the heat conduction layer, (ii) the first leg, (iii) the second leg, (iv) the third leg and (iv) the fourth leg are a single entity.

11. A method of testing a device with automatic test equipment using an apparatus, wherein the apparatus comprises a heat sink, a heat conduction layer coupled to the heat sink, a first leg coupled to the heat conduction layer, a second leg coupled to the heat conduction layer, wherein the second leg is spaced apart from the first leg, wherein the heat sink comprises a plurality of fins extending from the heat sink, wherein the heat sink is configured to engage the device, wherein a first vacuum path passes through the heat sink, wherein a second vacuum path passes through the first leg, wherein a third vacuum path passes through the second leg, and wherein the first vacuum path is different from each of the second vacuum path and the third vacuum path, and wherein the method comprises: engaging the device with the apparatus; applying a vacuum to the (i) first vacuum path, (ii) the second vacuum path, and (iii) the third vacuum path to hold the device with the apparatus; and during testing of the device, moving air within the automatic test equipment such that air moves past the fins.

12. The method of claim 11, wherein the heat conduction layer comprises a single vacuum path that braches out to form the first vacuum path, the second vacuum path and the third vacuum path.

13. The method of claim 11, wherein the first vacuum path passes through a central section of the heat sink.

14. The method of claim 11, wherein the device comprises a semiconductor chip coupled to a substrate, and wherein applying the vacuum further comprises: applying the vacuum in the second vacuum path and the third vacuum path to engage the substrate with the apparatus; and applying the vacuum in the first vacuum path to engage the semiconductor chip with the apparatus.

15. The apparatus of claim 1, wherein the heat conduction layer comprises a single vacuum path that braches out to form the first vacuum path, the second vacuum path and the third vacuum path.

16. The apparatus of claim 1, wherein the first vacuum path passes through a central section of the heat sink.

17. The apparatus of claim 1, wherein: the device comprises a semiconductor chip coupled to a substrate; the second vacuum path and the third vacuum path are configured to engage the substrate; and the first vacuum path is configured to engage the semiconductor chip.

18. An apparatus comprising: a heat sink, wherein the heat sink comprises a plurality of fins extending from the heat sink, and wherein the heat sink is configured to engage a device under test; a heat conduction layer coupled to the heat sink; a first leg coupled to the heat conduction layer; and a second leg coupled to the heat conduction layer, wherein a vacuum path passes through a central section of the heat sink, and wherein the vacuum path permits the apparatus to engage the device under test.

* * * * *